(12) United States Patent
Yoo et al.

(10) Patent No.: US 7,348,189 B2
(45) Date of Patent: Mar. 25, 2008

(54) FIELD TRANSISTOR MONITORING PATTERN FOR SHALLOW TRENCH ISOLATION DEFECTS IN SEMICONDUCTOR DEVICE

(75) Inventors: Hung Ryul Yoo, Seoul (KR); Sun Ju Kim, Inchcon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 129 days.

(21) Appl. No.: 11/293,660

(22) Filed: Dec. 2, 2005

(65) Prior Publication Data

US 2006/0148138 A1     Jul. 6, 2006

(30) Foreign Application Priority Data

Dec. 30, 2004    (KR)    ............ 10-2004-0117512

(51) Int. Cl.
*H01L 21/66*    (2006.01)
(52) U.S. Cl. ............... 438/14; 438/18; 438/424
(58) Field of Classification Search ............ 438/14–18, 438/424
See application file for complete search history.

(56) References Cited

U.S. PATENT DOCUMENTS 5,614,750 A    3/1997    Ellul et al.
6,452,246 B1 *    9/2002    Komori ............ 257/506
6,452,252 B1    9/2002    Nagatomo
6,906,363 B2    6/2005    Suzuki
6,908,857 B2    6/2005    Akamatsu et al.

OTHER PUBLICATIONS

Kang, Jung Ho; Composite Pattern for Monitoring Various Defects of Semiconductor Device; U.S. Appl. No. 11/324,168, filed Dec. 29, 2005.

* cited by examiner

*Primary Examiner*—Dung A. Le
(74) *Attorney, Agent, or Firm*—Andrew D. Fortney

(57) ABSTRACT

A field transistor monitoring pattern has two active areas, i.e., a source region and a drain region, spaced apart from each other by an STI area intervening therebetween. The STI area is generally narrower than each active area. The monitoring pattern further has two gate patterns, each having a gate trunk and at least one gate branch extending from the gate trunk and crossing over both active areas. The monitoring pattern can be used to check an isolation property of the STI area by applying the same voltages to both gate patterns and then measuring leakage current between both active areas. Additionally, by applying different voltages to both gate patterns and detecting leakage current therebetween, the monitoring pattern can monitor unfavorable dimple defects potentially produced in the STI area.

6 Claims, 4 Drawing Sheets

FIELD TRANSISTOR MONITORING PATTERN FOR SHALLOW TRENCH ISOLATION DEFECTS IN SEMICONDUCTOR DEVICE

CROSS REFERENCE TO RELATED APPLICATIONS

This U.S. non-provisional application claims priority under 35 U.S.C. §119 from Korean Patent Application No. 2004-117512, which was filed in the Korean Intellectual Property Office on Dec. 30, 2004, the contents of which are incorporated by reference herein in its entirety.

BACKGROUND OF THE INVENTION

1. Field of the Invention

The present invention relates generally to a field transistor monitoring pattern for shallow trench isolation (STI) defects in semiconductor devices and, more particularly, to a field transistor pattern that is capable of monitoring dimple defects potentially produced in an STI area.

2. Description of the Related Art

Isolation structures, such as LOCOS and STI, are frequently used for electrically isolating active areas in semiconductor devices. STI is a relatively new process that may be implemented on sub-0.18-micron technologies as an alternative to LOCOS. STI eliminates certain problems traditionally associated with LOCOS, while enabling formation of active areas with higher density. Additionally, the flatness or planarity of the resulting wafer enables more precise pattern definition for subsequent layers.

The typical STI process starts from forming, in sequence, a pad oxide layer and a pad nitride layer on a silicon substrate. Both pad layers are patterned to expose substrate portions predetermined as isolation (or field) areas. Exposed portions of the silicon substrate are etched to form a trench therein. Oxide material is deposited sufficient to fill the trench and then polished for planarization. Finally, the remaining pad layers are completely removed, and the remaining trench oxide layer defines an STI area.

In order to obtain a better trench-filling property, a high-density plasma chemical vapor deposition (HDP-CVD) is widely used in the art. However, in case of a narrow trench, unfavorable voids or seams may often occur in the trench oxide layer during a trench-filling process. FIG. 1 shows, in a cross-sectional view, the voids (V) in the trench oxide layer 20. In FIG. 1, reference numerals 10, 11 and 12 represent the silicon substrate, the pad oxide layer, and the pad nitride layer, respectively.

Unfortunately, after polishing the trench oxide layer 20, such a void or seam may invite a waterdrop-like dimple filled with polysilicon when a polysilicon layer is deposited over the STI area in a subsequent process. FIGS. 2 and 3 respectively show, in a cross-sectional view and a plan view, dimple images obtained by scanning electron microscope (SEM). In FIGS. 2 and 3, reference numerals 30 and 22 represent the polysilicon layer and the dimple, respectively. Furthermore, reference characters A and F indicate an active area and a field (oxide) area, respectively. The dimple filled with polysilicon may often cause leakage current between adjacent gate lines that may be formed from the polysilicon layer, resulting in poor isolation properties of semiconductor devices.

A field transistor monitoring pattern has been conventionally used to measure field oxide isolation properties. FIG. 4 shows, in a plan view, a conventional field transistor monitoring pattern.

Referring to FIG. 4, the field transistor monitoring pattern includes a source region 1a and a drain region 1b, which are formed in the silicon substrate and which are spaced apart from each other by the field oxide area F. The monitoring pattern further includes a gate pattern 1c formed on the silicon substrate. The gate pattern 1c has a plurality of gate branches Gb that cross over and extend at right angles to the source region 1a, the drain region 1b, and the field oxide area F.

The above-discussed monitoring pattern is used for measuring the isolation property of the field oxide area F. Specifically, by applying a voltage to the gate pattern 1c, it is possible to check if leakage current exists or not between the source region 1a and the drain region 1b.

However, the conventional monitoring pattern is generally used for measuring electrical isolation between the active areas separated by the field oxide area F, and is not believed to be capable of in-line monitoring the aforementioned dimple defects in the STI area. That is, it is hard to measure leakage current that may arise between polysilicon gate patterns due to the dimples in the STI area using the conventional monitoring pattern. Thus, there is a need for a solution to check whether or not a dimple defect exists in the STI area.

SUMMARY OF THE INVENTION

Exemplary, non-limiting embodiments of the present invention provide a field transistor monitoring pattern capable of checking for the presence of dimple defects, as well as checking the isolation properties of an STI area.

According to an exemplary embodiment of the present invention, the field transistor monitoring pattern comprises a first active area and a second active area, both of which are formed in the silicon substrate and spaced apart from each other. The monitoring pattern further comprises an STI area, which is formed in the silicon substrate and intervenes between the first active area and the second active area. The monitoring pattern still further comprises a first gate pattern and a second gate pattern, both of which are formed on the silicon substrate. Each gate pattern has a gate trunk and at least one gate branch extended from the gate trunk and crossing over both active areas.

In the monitoring pattern, the STI area may be narrower than each active area. Additionally, the width of the STI area may not exceed a quarter of the width of each active area.

The first gate pattern and the second gate pattern may comprise polysilicon. Furthermore, the first gate trunk and the second gate trunk may be located at opposite sides of both active areas.

Each gate pattern may have a plurality of gate branches extended from each gate trunk and crossing over both active areas. In this case, the gate branches of the gate patterns may be arranged in an alternating sequence.

DETAILED DESCRIPTION OF EXEMPLARY EMBODIMENTS OF THE INVENTION

Exemplary, non-limiting embodiments of the present invention will now be described more fully hereinafter with reference to the accompanying drawings. This invention may, however, be embodied in many different forms and should not be construed as limited to any particular exemplary embodiment(s) set forth herein. Rather, the disclosed embodiments are provided so that this disclosure may more fully convey the scope and/or implementation of the invention to those skilled in the art. The principles and features of this invention may be employed in varied and numerous embodiments without departing from the scope of the invention.

It is noted that well-known structures and processes are not described or illustrated in detail to avoid obscuring the essence of the present invention. It is also noted that the figures may not be drawn to scale. Rather, for simplicity and clarity of illustration, the dimensions of some of the elements may be exaggerated relative to other elements.

Figure 1:
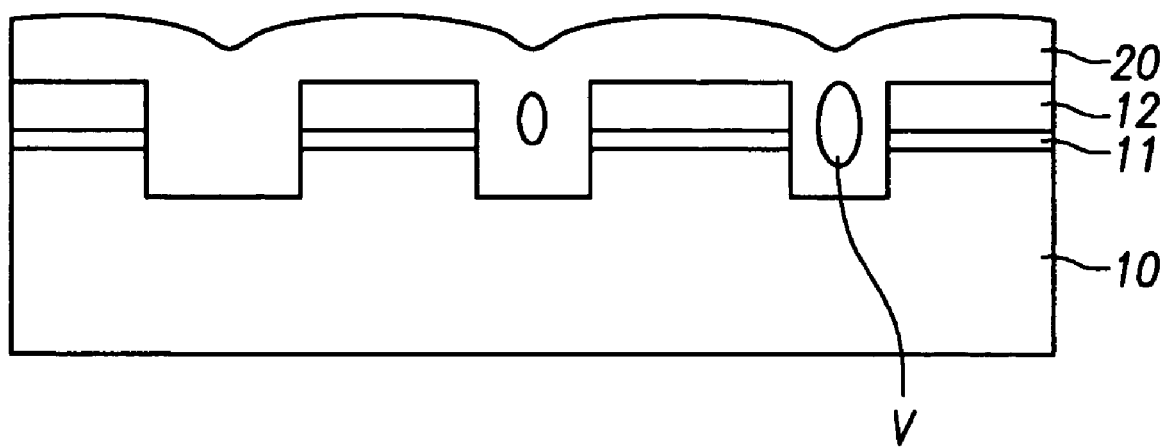
FIG. 1 is a cross-sectional view showing voids in a trench oxide layer.
Figure 2:
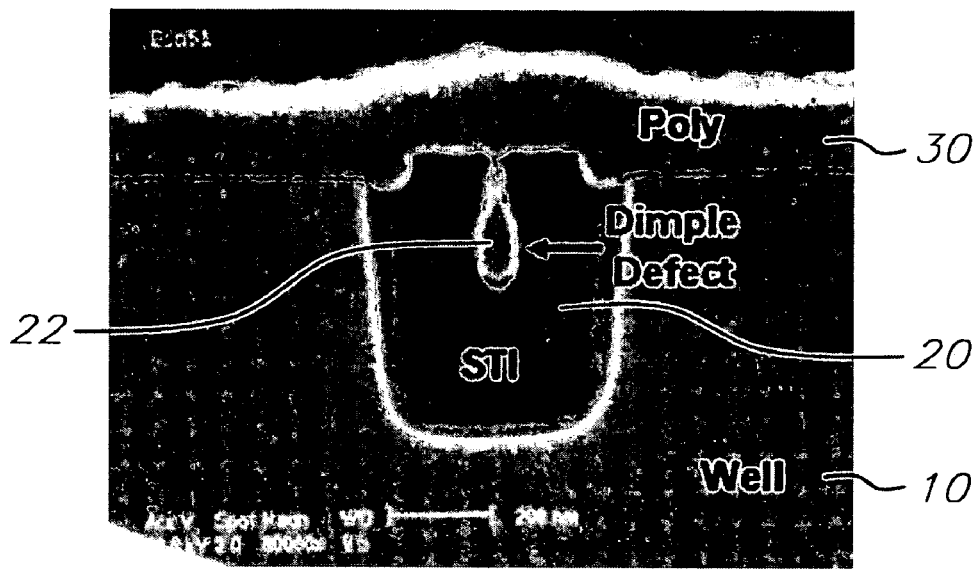
FIGS. 2 and 3 are a cross-sectional view and a plan view, respectively, of SEM images of dimples caused by the voids.
Figure 3:
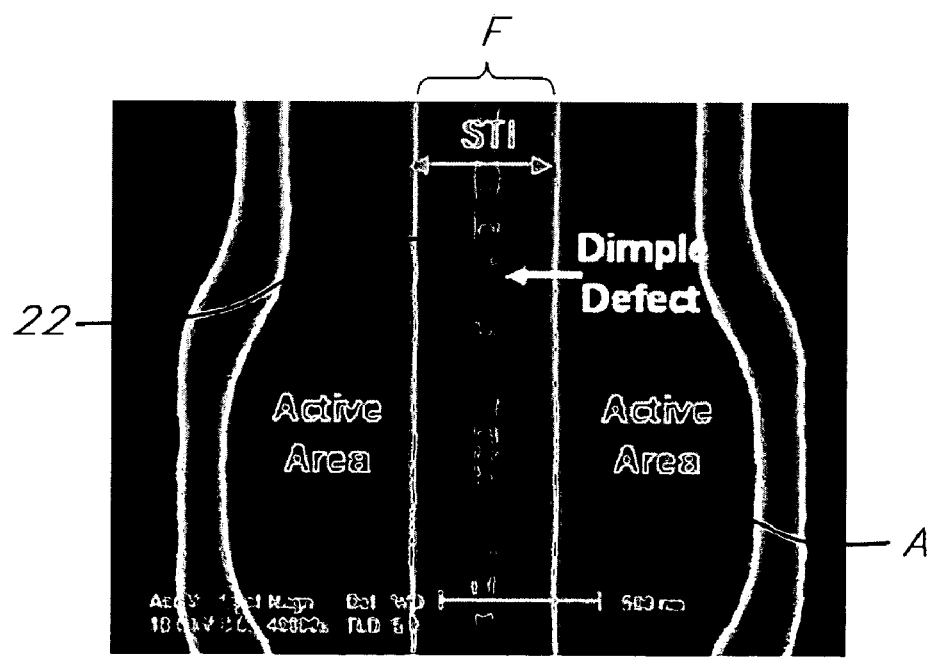
Figure 4:
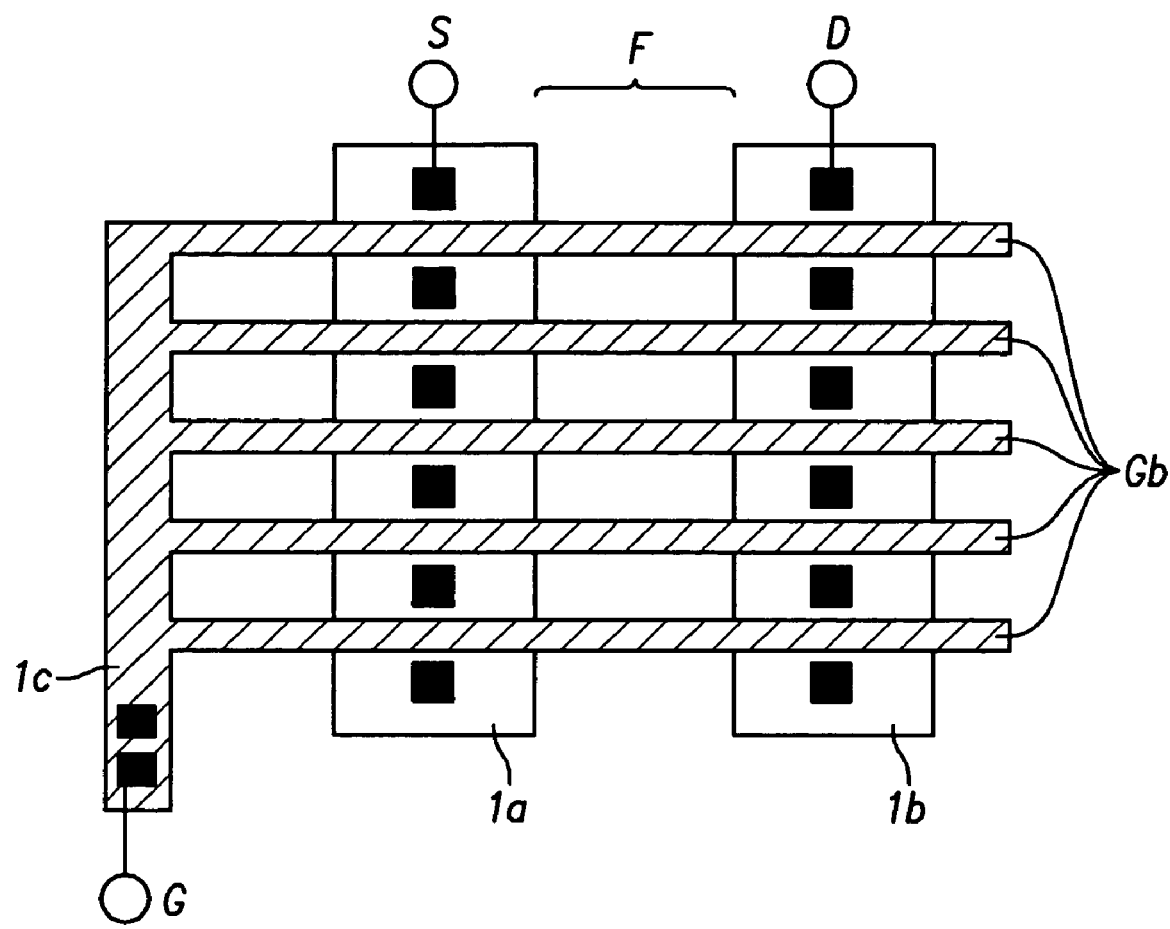
FIG. 4 is a plan view showing a conventional field transistor monitoring pattern.
Figure 5:
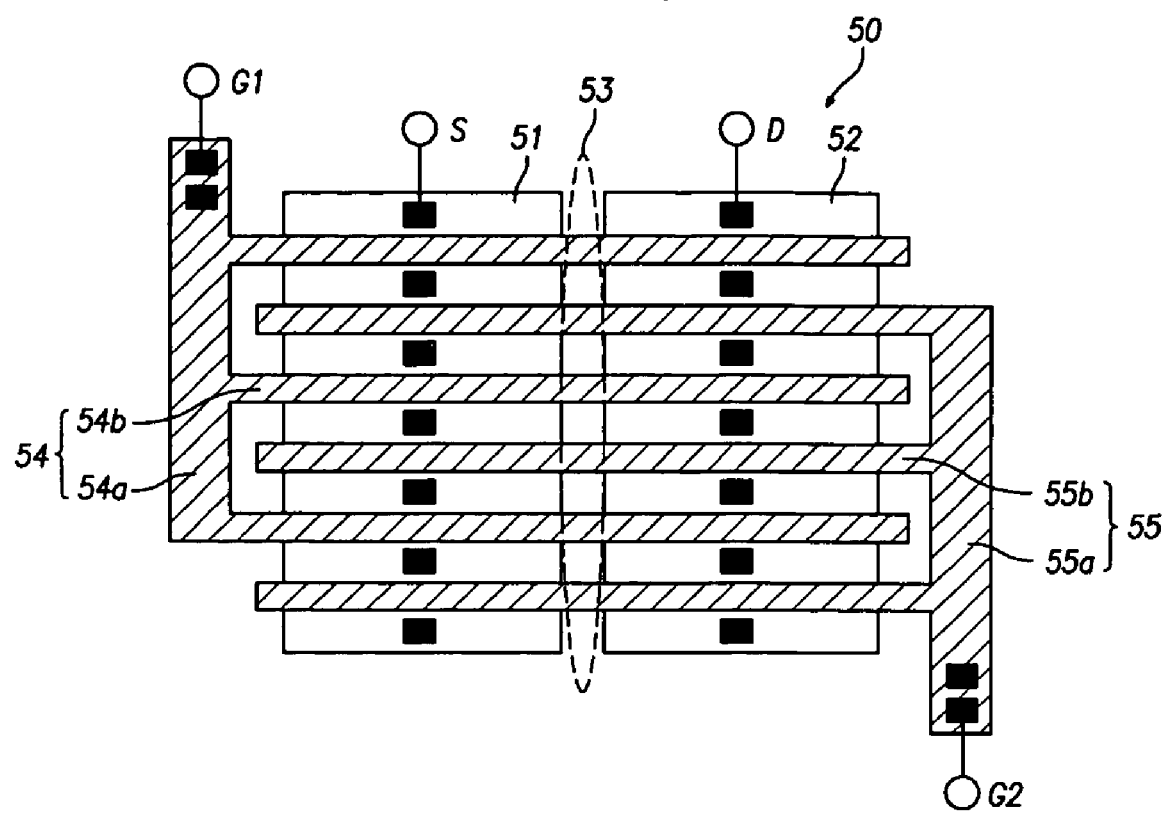
FIG. 5 is a plan view showing a field transistor monitoring pattern in accordance with an exemplary embodiment of the present invention.

FIG. 5 shows, in a plan view, a field transistor monitoring pattern 50 in accordance with an exemplary embodiment of the present invention.

Referring to FIG. 5, the field transistor monitoring pattern 50 includes a first active area (e.g., a source region) 51 and a second active area (e.g., a drain region) 52, which are formed in a silicon substrate. Furthermore, an STI area 53 is formed in the silicon substrate, intervening between both active areas 51 and 52. The first and the second active areas 51 and 52 are therefore spaced apart and electrically isolated from each other at least in part by the STI area 53.

In particular, the STI area 53 is much narrower than the active areas 51 and 52. Specifically, it is desirable that the width of the STI area 53 does not exceed a quarter of the width of each active area 51 and 52. Such a relatively narrow STI area 53 is suitable for monitoring unfavorable leakage current that may exist between gate patterns due to conventional dimple defects.

The monitoring pattern 50 further includes two gate patterns 54 and 55 formed from polysilicon on the silicon substrate. A first gate pattern 54 has a first gate trunk 54a and a plurality of first gate branches 54b. Similarly, a second gate pattern 55 has a second gate trunk 55a and a plurality of second gate branches 55b. The gate branches 54b and 55b extend from the corresponding gate trunk 54a and 55a, running parallel with each other. The first and second gate patterns 54 and 55 may comprise polysilicon (which may further comprise a metal silicide layer thereon, such as tungsten silicide, titanium silicide, molybdenum silicide, etc.).

Moreover, the gate branches 54b and 55b cross over both active areas 51 and 52, making right angles with the active areas 51 and 52 (notably a long axis of the active areas 51 and 52). The first and the second gate trunks 54a and 55a are located at opposite sides of the active areas 51 and 52. Additionally, the first and the second gate branches 54b and 55b are arranged by turns (e.g., in alternating sequence).

The monitoring pattern 50 of the invention can be used for checking one or more isolation properties of the STI area 53. Specifically, the same voltage is applied to both gate patterns 54 and 55 through their respective terminals G1 and G2. Then, a current is measured between both active areas 51 and 52 (e.g., through their respective terminals S and D). If the STI area 53 has poor isolation property, leakage current may be detected by such measurement.

The monitoring pattern 50 can be also used for monitoring or determining the presence of dimple defects that may potentially occur in the STI area 53. Specifically, different voltages are applied to both gate patterns 54 and 55 through their respective terminals G1 and G2. If there is a dimple filled with polysilicon in the STI area 53, leakage current may be detected between the gate patterns 54 and 55. It is believed that a current may be detected between the gate patterns 54 and 55 due to a short circuit that may form between the gate patterns 54 and 55 when a dimple defect is filled with polysilicon.

Thus, the invention further pertains to a method of determining one or more isolation properties of a shallow trench isolation (STI) structure, comprising applying a voltage to first and second gate patterns, and measuring a current between the first and second active areas. The first and second gate patterns generally have the pattern and/or structure described herein (e.g., a gate trunk and at least one gate branch extending from the gate trunk and crossing over first and second active areas). The STI structure is generally in the substrate, between the first and second active areas.

In one embodiment, as described above, the STI area may have a width that does not exceed a quarter of a corresponding width of each active area. In a further embodiment, the first and second gate patterns each comprise a gate trunk, and the gate trunks of first and second gate patterns are at opposite sides of the first and second active areas. Furthermore, each gate pattern may have a plurality of gate branches extending from the gate trunk and crossing over both active areas, and the gate branches of the gate patterns may be arranged in an alternating sequence.

In general, the method of determining one or more isolation properties of an STI structure further comprises determining whether the current is above a threshold current. Also, the current is generally correlated to at least one isolation property of the STI structure.

Also, the invention pertains to a method of detecting a dimple defect in a shallow trench isolation (STI) structure, comprising applying a first voltage to a first gate pattern, applying a second voltage to a second gate pattern, and measuring a current between the first and second gate patterns. In this method, the first voltage may be significantly greater than the second voltage. For example, the first voltage may be about an operating voltage (e.g., VCC), and the second voltage may be about a ground potential (e.g., VDD or about 0 volts).

As mentioned above, each of the first and second gate patterns generally has a gate trunk and at least one gate branch extending from the gate trunk and crossing over first and second active areas, and the STI structure is generally between the first and second active areas.

As for the method of determining one or more isolation properties of an STI structure, the method of detecting a dimple defect in an STI structure may further comprise determining whether the current is above a threshold current, which threshold current may be correlated to at least one dimple defect in the STI structure.

As discussed hereinbefore, the monitoring pattern according to the present invention allows not only checking isolation property of the STI area, but also monitoring unfavorable dimple defects potentially produced in the STI area.

While this invention has been particularly shown and described with reference to an exemplary embodiment thereof, it will be understood by those skilled in the art that various changes in form and details may be made therein without departing from the spirit and scope of the invention as defined by the appended claims.

What is claimed is:

1. A method of detecting a dimple defect in a shallow trench isolation (STI) structure, comprising:
    applying a first voltage to a first gate pattern, the first gate pattern having a first gate trunk and at least one first gate branch extending from the first gate trunk and crossing over first and second active areas, the STI structure being between the first active area and the second active area;
    applying a second voltage to a second gate pattern, the second gate pattern having a second gate trunk and at least one second gate branch extending from the second gate trunk and crossing over the first and second active areas;
    measuring a current between the first and second gate patterns;
    wherein each gate pattern has a plurality of gate branches extending from each gate trunk and crossing over both active areas.

2. The method of claim 1, further comprising determining whether the current is above a threshold current.

3. The method of claim 2, wherein the threshold current correlates to at least one dimple defect in the STI structure.

4. The method of claim 1, wherein the first voltage is significantly greater than the second voltage.

5. The method of claim 1, wherein the STI area has a width that does not exceed a quarter of a corresponding width of each active area.

6. The method of claim 1, wherein the gate branches of the gate patterns are arranged in an alternating sequence.

* * * * *